United States Patent [19]
Asplund

[11] Patent Number: 5,117,323
[45] Date of Patent: May 26, 1992

[54] ELECTRODE LINE PROTECTION

[75] Inventor: Gunnar Asplund, Ludvika, Sweden

[73] Assignee: ASEA Brown Boveri AB, Västeras, Sweden

[21] Appl. No.: 408,967

[22] Filed: Sep. 13, 1989

[30] Foreign Application Priority Data

Sep. 21, 1988 [SE] Sweden .............................. 8803343

[51] Int. Cl.$^5$ .............................................. H02H 3/16
[52] U.S. Cl. .......................................... 361/47; 361/42
[58] Field of Search .................. 361/42, 67, 68, 47, 361/48, 49, 50

[56] References Cited

U.S. PATENT DOCUMENTS

| | | | |
|---|---|---|---|
| 4,188,574 | 2/1980 | Allington | 324/51 |
| 4,638,245 | 1/1987 | MacPhee et al. | 324/51 |
| 4,939,486 | 7/1990 | Bergdahl | 363/45 |

OTHER PUBLICATIONS

"Power Transmission" by Erih Uhlmann, Springer-Verlag Berlin Heidelberg New York 1975, pp. 282-284.

Primary Examiner—Steven L. Stephan
Assistant Examiner—Adolf Berhane
Attorney, Agent, or Firm—Pollock, Vande Sande & Priddy

[57] ABSTRACT

A converter station for power transmission by means of high voltage direct current has an electrode line protective device for detection of ground faults on the electrode line of the station. An alternating voltage generator injects an alternating signal with a predetermined frequency on the electrode line. The two ends of the electrode line are provided with suppression filters tuned to the measuring frequency. The suppression filter arranged at the remote end of the electrode line is matched, by means of a resistor to the wave impedance of the electrode line. An impedance measuring device senses the impedance of the electrode line at the feeding point in relation to the ground at the measuring frequency. An indicating signal is delivered from the measuring device if the impedance measured deviates from the impedance of the electrode line when in a faultless state.

6 Claims, 3 Drawing Sheets

ELECTRODE LINE PROTECTION

TECHNICAL FIELD

The present invention relates to an electrode line protective device for detection of ground faults in the electrode line of a convertor station provided with an electrode line and designed for power transmission by means of a high voltage direct current, the protective device comprising means arranged, at a feeding point at one end of the electrode line, to supply the electrode line with an alternating voltage or alternating current signal with a predetermined frequency, and further suppression filters, tuned to the predetermined frequency, at both ends of the electrode line, and means for determining the impedance of the electrode line at the feeding point in relation to ground at the predetermined frequency.

BACKGROUND ART OF THE INVENTION

A plant for power transmission by means of high voltage direct current comprises two convertor stations interconnected by a d.c. line. In a single-pole d.c. transmission, the stations are interconnected by means of one single d.c. conductor, the return current being conducted through ground. One d.c. pole in each station is then connected to ground by means of an efficient ground terminal. Normally, this is arranged at a distance from the convertor station and connected to the station via a so-called electrode line. It may often be desirable or necessary to locate the ground terminal at a long distance from the station, up to several hundred kilometers from the station.

In a so-called bipolar d.c. transmission, the stations are interconnected by means of two d.c. conductors and in normal operation, therefore, the direct current need not be returned through ground. For several reasons, among other things to make possible single-pole operation of the plant in case of a convertor failure, also convertor stations in bipolar transmissions are provided with a ground terminal which is connected to the station by means of an electrode line.

An electrode line is insulated relative to ground and normally consists of a pole line suspended from insulators. Even if the voltage of the electrode line to ground is normally low in relation to other voltages in the plant, a ground fault on the electrode line causes a risk of personal injuries and of damage to other plant components, for example corrosion damage. It is therefore important that ground faults, also high-ohmic ground faults, can be rapidly and effectively detected.

Proposals have been made to use a differential protective device for detection of ground faults in an electrode line. In such a protective device, the current at both ends of the electrode line is measured, and a difference appearing between the two measured currents is an indication of a ground fault. However, such a protective device has several drawbacks. It requires a communication link between the two ends of the electrode line and therefore, especially in connection with long electrode lines, becomes expensive and not fully reliable. Further, it has been found to be difficult or impossible to design such a protective device to become capable of detecting high-ohmic ground faults. Nor does a protective device of this kind react on a ground fault occurring in those cases in which the electrode line does not carry any current, which is normally the case in undistrubed operation of a bipolar transmission. Also in this case, i.e. is when no direct current flows through the electrode line, harmonic currents may give rise to dangerous voltages on the line.

It has furthermore been proposed to detect ground faults on an electrode line by injecting, at the convertor station, an alternating current or alternating voltage signal of a predetermined frequency on the line. Suppression filters are then arranged at the two ends of the line, these filters being tuned to the injection frequency. An impedance measuring device is arranged to measure the impedance of the electrode line at the feeding point in relation to ground at the injection frequency. A change of the impedance thus measured is an indication of a ground fault. This method functions well in the case of short electrode lines but exhibits drawbacks in long electrode lines. Since it is necessary to select the measuring frequency so low that standing waves on the electrode lines are avoided, the length of the line must be less than one-fourth of a wavelength at the current frequency. In the case of long electrode lines, for this reason, such a low frequency must be selected that there will be a risk that the measurement is disturbed by the mains frequency or by the lowest harmonics of the mains frequency. Further, at these low frequencies the suppression filters, which are arranged at both ends of the electrode line and which must be dimensioned for maximum electrode line current, will be large and expensive.

SUMMARY OF THE INVENTION

The present invention aims to provide an electrode line protective device of the kind described in the introduction, in which, also in case of long electrode lines, a high measuring frequency can be used and hence the dimensions and cost of the suppression filters be greatly reduced and also the risk of interference by the mains frequency or its harmonics be greatly reduced.

In an electrode line protective device according to the invention, in order to avoid standing waves in the electrode line, the suppression filter at the end of the electrode line, remote in relation to the feeding point, is provided with resistive means having such a resistance that the filter is matched to the wave impedance of the electrode line. In this way it is avoided that the measuring signal be reflected in the remote end of the electrode line, thus preventing the occurrence of standing waves on the line. The measuring frequency can therefore be selected high, also in the case of long electrode lines, which provides the advantages mentioned above. In an electrode line protective device according to the invention, it has proved that in the case of a long electrode line, the measuring frequency can be selected twenty to forty times as high as has previously been possible. This considerable increase of the measuring frequency gives a corresponding reduction of the dimensions of the reactive components of the suppression filters and hence of their cost. Furthermore, the risk of interference of the measurement by the mains frequency or its harmonics is greatly reduced, which in the case of long electrode lines gives a considerably more reliable and more selective ground fault detection that what has hitherto been possible.

BRIEF DESCRIPTION OF THE DRAWING

The invention will be described in the following with reference to the accompanying drawings, wherein.

DESCRIPTION OF THE PREFERRED EMBODIMENTS

Figure 1:
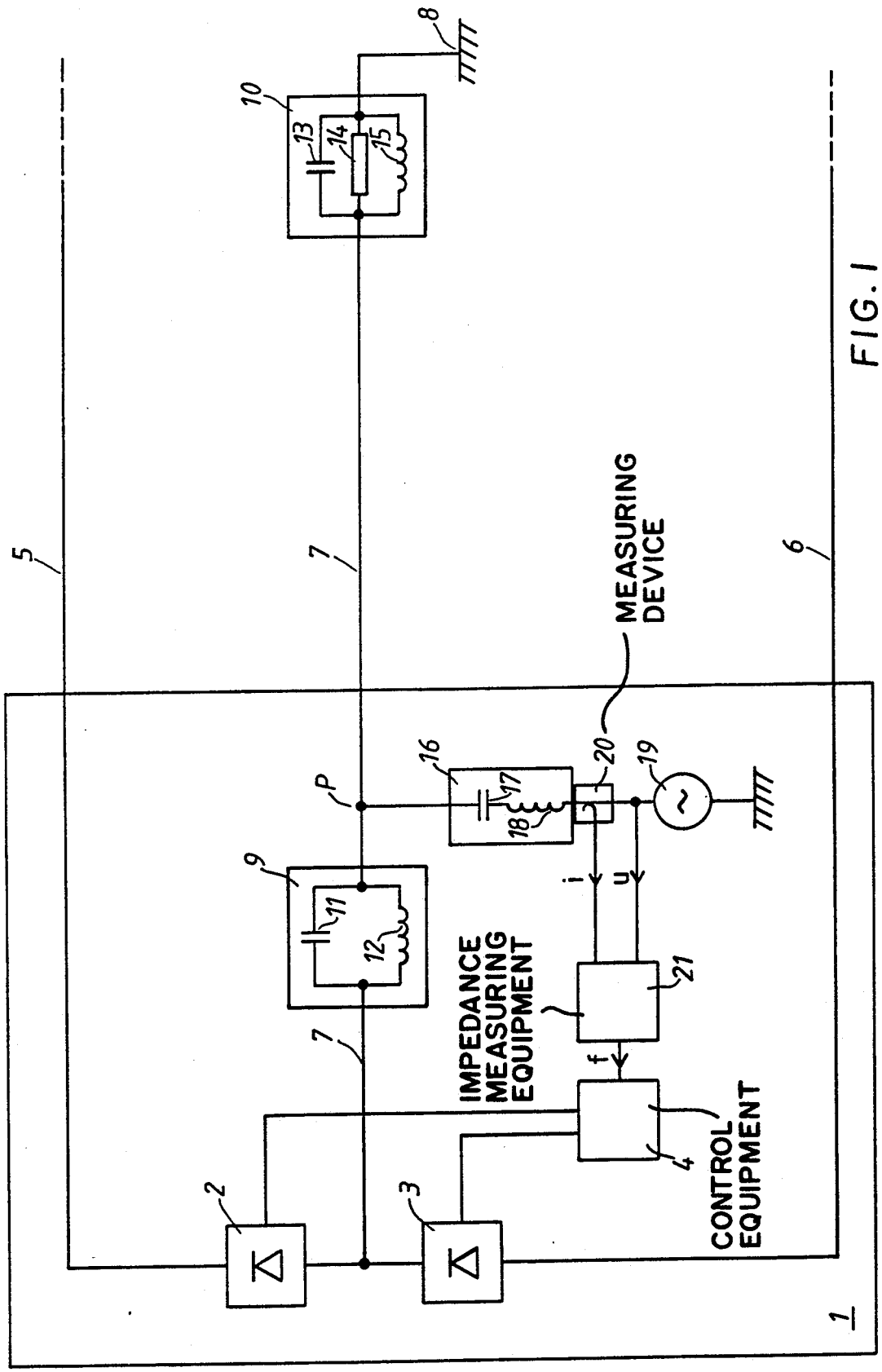
FIG. 1 shows a convertor station provided with an electrode line protective device according to the present invention.

FIG. 1 shows a convertor station 1 in a bipolar d.c. transmission. The station has two series-connected convertors 2 and 3. The convertors are connected to the two d.c. lines 5 and 6 of the transmission. The point of connection of the convertors is connected, via an electrode line 7, to a ground electrode 8. Suppression filters 9 and 10 are arranged at the two ends of the electrode line. The suppresion filter 9 consists of a parallel resonance circuit with an inductor 12 and a capacitor bank 11. In the same way, the suppression filter 10 consists of a parallel resonance circuit with a capacitor bank 13 and an inductor 15. The filters 9 and 10 are tuned to approximately the measuring frequency, that is the frequency of the voltage generator 19. Further, the filter 10 includes a resistor 14, connected parallel to the capacitive and inductive branches of the filter, for adaptation of the impedance of the filter. The resistance of the resistor 14 is so chosen that it corresponds to the wave impedance of the electrode line 7. The latter is typically of about 300-400 ohms, and the resistance of the resistor 14 is therefore suitably selected to be a value equal to the wave impedance of the line. By this adaptation of the filter 10 to the wave impedance of the line, it is avoided that the measuring signal used is reflected in the filter, whereby, as mentioned above, standing waves on the electrode line are avoided and high measuring frequencies can be used also in the case of long electrode lines.

The adaptation of the suppression filter 10 to the wave impedance of the line need not be exact; the advantages mentioned above are also obtained, albeit to a reduced degree, if the impedance of the filter at the measuring frequency deviates from the wave impedance of the line. However, it has proved that the impedance of the filter at the measuring frequency should preferably not deviate by more than a factor of 2 from the wave impedance of the line, that is the resistance of the resistor 14 should preferably lie between half the wave impedance and double the wave impedance.

The measuring frequency is selected so as not to coincide with any of the harmonics generated in the convertor station. A typical value of the measuring frequency may be 800-1000 Hz, but both higher and lower frequencies are feasible.

In the convertor station 1 an a.c. voltage generator 19 is arranged which generates an alternating voltage with the measuring frequency selected. The generator 19 may consist of an oscillator which controls a power amplifier. The output voltage of the generator is supplied to the electrode line at the feeding point P via a series resonance filter 16, which comprises an inductor 18 and a capacitor bank 17. The series filter 16 is tuned to the measuring frequency. The generator voltage u is sensed and supplied to an impedance measuring device 21. By means of a measuring device 20 the current flowing from the generator to the line is also sensed, and a measuring signal i corresponding to the instantaneous value of this current is also supplied to the impedance measuring device 21.

The impedance measuring device may consist of a known impedance relay or of any other digital or analog calculating circuit with the corresponding function. The measuring device forms the complex impedance Z by vectorial division of the voltage vector U which corresponds to the generator voltage with the current vector I which corresponds to the current flowing from the generator to the line, i.e.

$$Z = U/I = R + jX$$

where R is the real portion of the impedance and X its imaginary portion. The complex impedance of the electrode line thus measured is compared with a preset value corresponding to the impedance of the electrode line when in faultless condition. This comparison may, for example, be made according to the principle shown in FIG. 2. A certain impedance consists of a point in the phase plane shown in FIG. 2. The impedance of the line in a faultless condition is designated by the point Z1. The function characteristic of the measuring device consists of a circle A with the radius RO and with the center at Z1. The measuring device indicates a ground fault, if the measured impedance Z falls outside the circle A. An indication of a ground fault is thus obtained if the following condition is fulfilled $$|Z - Z1| > RO$$

Figure 2:
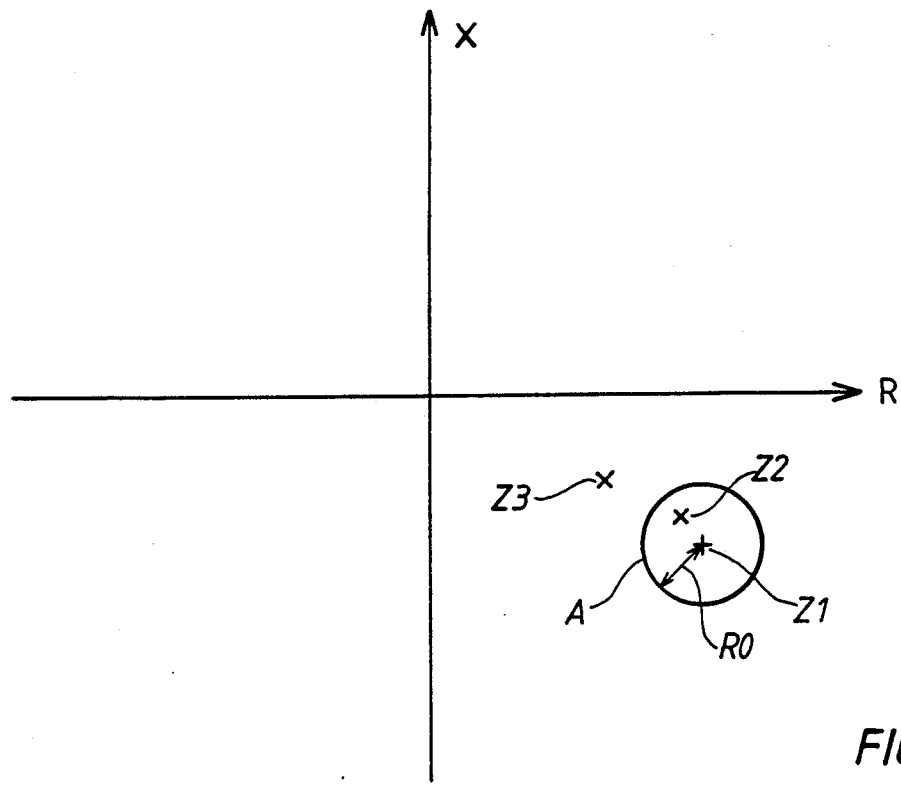
FIG. 2 shows the principle of the impedance measurement used in the protective device according to FIG. 1, FIGS. 3a and 3b show alternative embodiments of the suppression filter arranged at the remote end of the electrode line.

FIG. 2 shows two examples of measured impedances. At the measured impedance value Z2, no indication of ground fault is obtained whereas a ground fault is indicated at the measured impedance value Z3. Upon operation, the impedance measuring device 21 delivers an indicating signal f to the control equipment 4 of the convertor station. The indicating signal can be used to activate alarm or to bring about instantaneous or delayed automatic shutdown of the station, or for a combination of these measures.

Figure 3A:
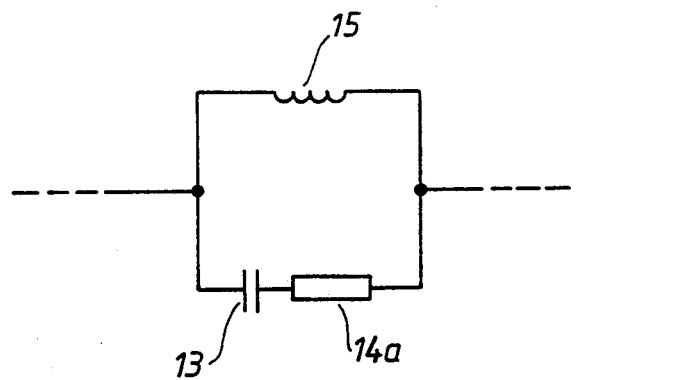
Figure 3B:
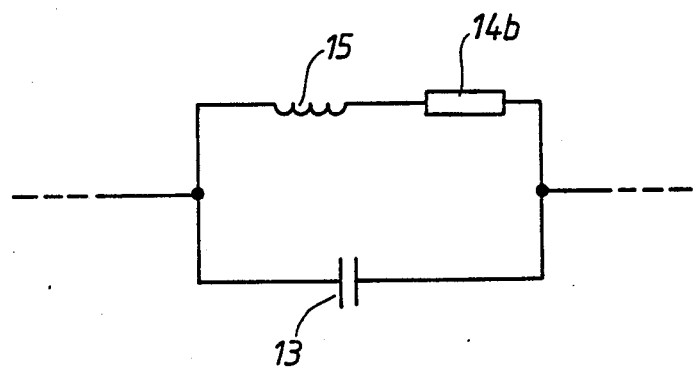

FIGS. 3a and 3b show two alternative examples of the arrangement of the resistor which is used for matching the suppression filter 10 to the wave impedance of the electrode line. In FIG. 3a the resistor designated 14a is connected in series with the capacitor bank 13 of the filter, a location that has proved to be advantageous in practice. As is shown in FIG. 3b, the resistor, designated 14b, can be alternatively arranged in series with the inductor 15 of the filter. To obtain adaptation of the filter to the wave impedance of the line, the resistance R of the resistors 14a and 14b, respectively, in the embodiments shown in FIGS. 3a and 3b, should, in a known manner, be selected from the expression $$R = ZO/Q^2$$

where ZO is the wave impedance of the line and Q the factor of merit of the filter.

Figure 4:
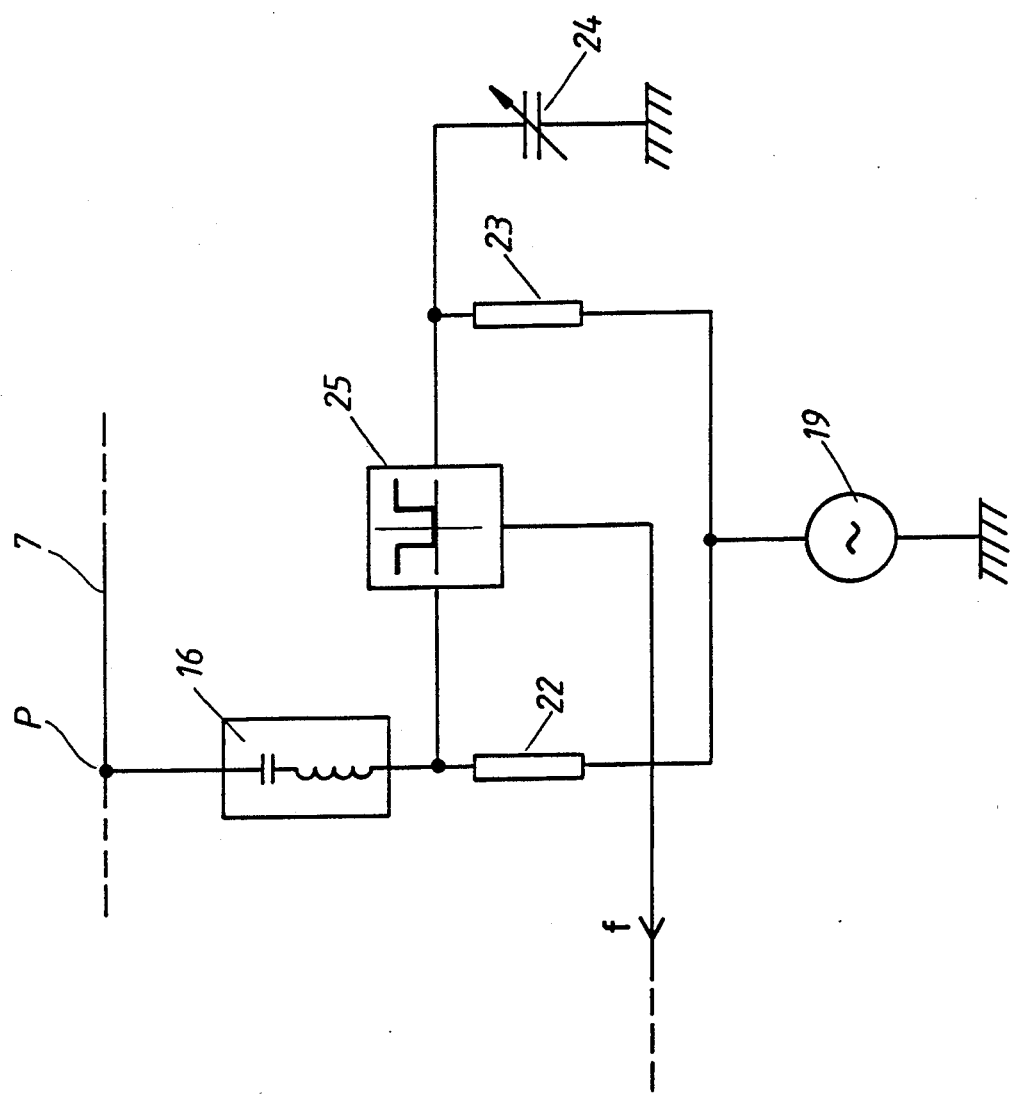
FIG. 4 shows an alternative embodiment of the detection members included in the electrode line protective device.

FIG. 4 shows an alternative embodiment of the impedance measuring device. The generator 19 is connected to the point of connection P of the electrode line 7 via the series resonance filter 16 and a resistor 22. Further, between the output terminal of the generator and ground a series circuit is arranged consisting of a resistor 23 and a variable capacitor 24. A voltage detector 25 is connected between, on the one hand, the connection point between the series circuit 16 and the resistor 22 and, on the other, the connection point between the resistor 23 and the capacitor 24. The resistors 22 and 23, the electrode line impedance and the capacitance of the capacitor 24 together form a measuring bridge. In a faultless state of the electrode line, the circuit is adjusted with the aid of the capacitor 24 so that the voltage sensed by the detector 25 is zero or near zero. In the case of a ground fault of the electrode line, the impedance thereof will be changed, a voltage occurring across and being sensed by the voltage detector 25. If the voltage sensed exceeds a predetermined level, the voltage detector 25 supplies an indicating signal f to the control equipment of the convertor station.

In the embodiment described above, the measuring signal is injected at the convertor end of the electrode line. It is, however, also possible to inject the measuring signal at another point on the electrode line, for instance at the ground terminal end of the line. In the latter case the filter 9 will be the filter at the remote end of the line as seen from the feeding point, and it is then this filter that is to be matched to the impedance of the electrode line.

I claim:

1. A protective device for detection of ground faults on an electrode line of a convertor station, the electrode line being adapted for power transmission by means of high voltage direct current, said protective device comprising:
   a) means provided at a feeding point at one end of the electrode line for supplying to the electrode line an alternating voltage or alternating current signal with a predetermined frequency;
   b) suppression filters provided at both ends of the electrode line and tuned to said predetermined frequency; and
   c) means for determining the impedance of the electrode line at the feeding point in relation to the ground at said predetermined frequency;
   wherein the suppression filter located at the end of the electrode line which is remote in relation to the feeding point, is provided with resistive members having such a resistance that the filter is matched to the wave impedance of the electrode line, whereby avoiding standing waves in the electrode line.

2. An electrode line protective device according to claim 1, wherein the resistances of the resistive members are selected such that the impedance of the filter at said predetermined frequency deviates from the wave impedance of the electrode line by no more than a factor of 2.

3. An electrode line protective device according to claim 1 wherein the suppression filter arranged at the remote end of the electrode line consists of a parallel resonance circuit with an inductive branch and a capacitive branch and wherein the resistive members comprise a resistor arranged in one of said branches.

4. An electrode line protective device according to claim 1, wherein the resistive members consist of a resistor connected in parallel with the suppression filter.

5. An electrode line protective device according to claim 2 wherein the suppression filter arranged at the remote end of the electrode line consists of a parallel resonance circuit with an inductive branch and a capacitive branch and wherein the resistive members comprise a resistor arranged in one of said branches.

6. An electrode line protective device according to claim 2, wherein the resistive members consist of a resistor connected in parallel with the suppression filter.

* * * * *